United States Patent [19]

Kirkland

[11] 4,107,607
[45] Aug. 15, 1978

[54] MAGNETOMETER USING A FIELD CONTROLLED OSCILLATOR, THE OSCILLATOR CORE BEING MAINTAINED NEAR ITS CURIE POINT

[75] Inventor: James L. Kirkland, Panama City, Fla.

[73] Assignee: The United States of America as represented by the Secretary of the Navy, Washington, D.C.

[21] Appl. No.: 836,829

[22] Filed: Sep. 26, 1977
(Under 37 CFR 1.47)

[51] Int. Cl.² .................................... G01R 33/02
[52] U.S. Cl. ............................ 324/253; 324/8; 324/224
[58] Field of Search ............. 324/244, 247, 203, 236, 324/253, 260, 3, 8, 224; 331/65; 73/362 CP

[56] References Cited

U.S. PATENT DOCUMENTS

| 2,407,536 | 9/1946 | Chapman | 324/253 |
| 2,648,823 | 8/1953 | Kock et al. | 73/362 CP |
| 2,671,275 | 3/1954 | Burns, Jr. | 324/247 |
| 3,564,401 | 2/1971 | Coon | 324/244 |

Primary Examiner—Robert J. Corcoran
Attorney, Agent, or Firm—Richard S. Sciascia; Harvey A. David

[57] ABSTRACT

A magnetometer wherein inductance of a resonant circuit is made sensitive to changes in magnetic field to vary an oscillator operating frequency. The magnetometer utilizes a ferromagnetic sensor element that is characterized by high permeability in weak magnetic fields when the element is maintained at predetermined elevated temperatures near the Curie point of the element material and also exhibits a hysteresis curve having a steep slope in the region of field strengths on the order of the earth's magnetic field. The preferred embodiment includes resistive heating of the element and use of substantially pure iron as the element material.

4 Claims, 5 Drawing Figures

MAGNETOMETER USING A FIELD CONTROLLED OSCILLATOR, THE OSCILLATOR CORE BEING MAINTAINED NEAR ITS CURIE POINT

BACKGROUND OF THE INVENTION

This invention relates to improvements in instruments for measuring magnetic fields, and more particularly to an improved magnetometer for use in low magnetic field strength situations characteristic of the earth's magnetic field, typically in the range of about 0.24 to about 0.64 oersted.

Magnetometers having sufficiently sensitivity to be capable of detecting or measuring small variations or anomalies in the earth's magnetic field are useful in a variety of applications including location of pipelines, cables, or other buried objects, sunken vessels, geological formations, military purposes, and the like. Among existing magnetometers for these purposes are those wherein the magnetic field sensor controls the frequency of operation of an oscillator, which frequency can be utilized to provide readout or apparatus control functions. Examples of such devices may be found in U.S. Pat. No. 2,991,414 to R. M. Tillman, U.S. Pat. No. 3,040,247 to R. L. Van Allen, and U.S. Pat. No. 3,461,387 to F. J. Morris, et al.

Magnetometers of the just mentioned type generally comprise magnetic field sensors in the form of specialized cores of high permeability material in combination with a winding forming part of the oscillator circuit. In order to achieve adequate sensitivity, the cores of the magnetometers of the above patents are subjected to an artificially high field through magnetic biasing, either by permanent magnets, by using concentrators, or by a field winding that is suitably energized. While such biasing serves to increase the permeability of the sensor core, it may introduce noise factors into the system as well as increase the weight, size and complexity of the magnetometer apparatus. Moreover, those expedients may cause undesirable effects on other instrumentation, for example in the case of magnetic mine hunting.

U.S. Pat. No. 3,239,826 to E. W. Yetter teaches the use in a transducer of a core material having a predetermined Curie point, and which changes state from paramagnetic or antiferromagnetic to ferromagnetic or ferrimagnetic at a temperature intermediate absolute zero and the Curie point, the change being characterized as a first order transition as compared to the Curie point change which is characterized as a second order transition. The exemplary core material is of relatively low permeability, on the order of 20 or 30, and would apparently require a considerable biasing field to achieve permeability that would approach the sensitivity required for use in measuring small changes in the earth's magnetic field.

Other known magnetometers include flux-gate types using second harmonic frequency generation and energy pumped gas or vapor, e.g., cesium vapor magnetometers. The former are subject to the same disadvantages mentioned earlier, while the latter is limited to total field sensing as opposed to magnetometers that are sensitive to directional components of a magnetic field and hence more useful in detecting the character of anomalies in the field. Each of these types of magnetometer requires substantial electrical power for operation, and are expensive to manufacture.

SUMMARY OF THE INVENTION

With the foregoing in mind, it is a principal object of this invention to provide an improved magnetometer suitable for use in detecting or measuring small changes or anomalies in magnetic fields of low strength.

Another object of the invention is to provide an improved magnetometer of the type wherein magnetic field is translated to frequency of operation of an oscillator.

Still another object is the provision of a magnetometer of the foregoing type that does not require the imposition of an auxiliary or biasing magnetic field, or the use of concentrator means.

Yet another object is the provision of a magnetometer that is characterized by freedom from operational noise.

As another object the invention aims to provide a sensitive magnetometer that is compact, light weight, relatively inexpensive, and requires little power for operation, thereby making it particularly suitable for portable use.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
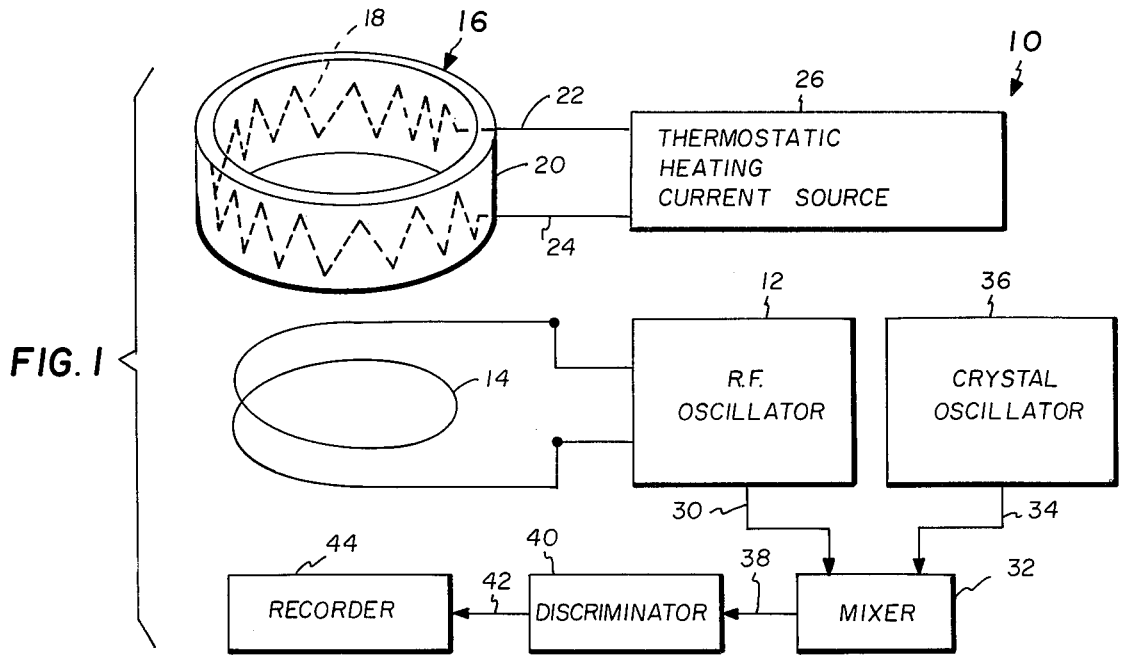
FIG. 1 is a diagrammatic illustration, partly in block form, of a magnetometer device embodying the invention.

In the exemplary form of the invention illustrated in FIG. 1, a magnetometer 10 comprises an R.F. (radio frequency) oscillator 12 having an inductance coil 14, the inductance L of which determines the operating frequency of the oscillator. The oscillator 12 may be of any well known type such as a Hartley oscillator, free-running multivibrator, or other form of oscillator suited to the measurement or control function desired.

Figure 2:
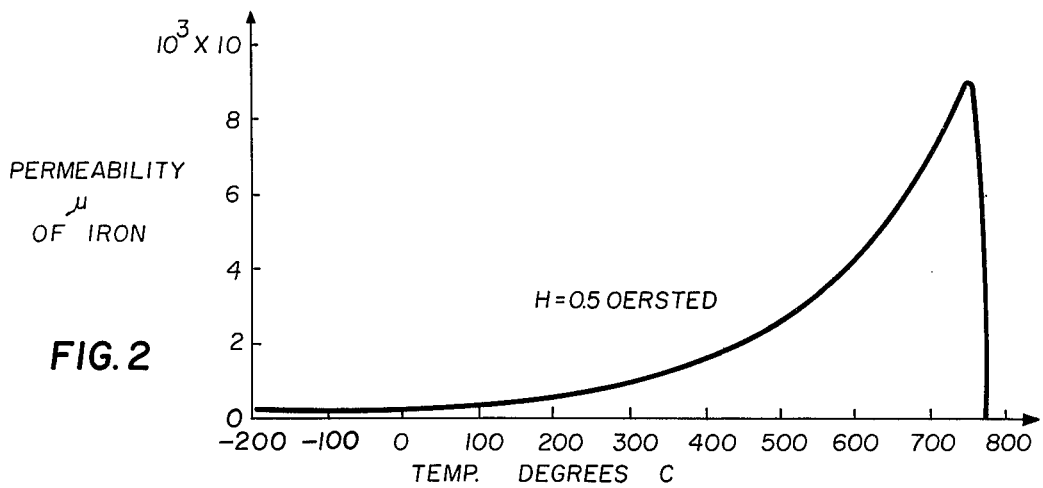
FIG. 2 is a graphic illustration of the permeability of substantially pure iron versue temperature in a low magnetic field.

Associated with coil 14 is a magnetic field sensor, generally indicated at 16. According to the invention, the sensor 16 comprises a ferromagnetic element 18 that is formed of a material which is characterized by a high degree of permeability, at least in weak magnetic fields, when held at a temperature substantially at, or very near to, its Curie point. In the present example the element 18 is in the form of a wire filament of substantially pure iron which exhibits variations in permeability with changes in temperature or in strength of magnetizing field. Thus, when the temperature of iron is raised, the permeability at weak magnetizing fields increases while for strong fields it decreases. FIG. 2 illustrates the changes in permeability of iron as its temperature is increased through the Curie point in a weak field, i.e., 0.5 oersted, representative of the earth's magnetic field. It will be noted that the permeability $\mu$ increases from a relatively constant value of less than 100 at and below room temperature to a maximum of over 8,000 at temperatures in a range between 700° and 800° C, that is at or near the Curie point or temperature of iron.

The iron element 18, which is adapted to be electrically heated and maintained substantially at its Curie temperature so as to provide a high permeability core element for the coil 14, is, in the present example, configured as a loop of iron wire which has been formed in a zig-zag manner to concentrate the mass thereof only in a cylindrical zone which will be most effective in affecting the inductance of the coil 14 without increasing the cross-sectional area of the wire itself. The iron wire element 18 is encased in an annular, evacuated or inert gas filled tube or casing 20 of a non-magnetic material such as glass or quartz, and the ends of the wire are connected, as shown by leads 22, 24, to a thermostatically controlled heating current source 26. The source 26 supplies electrical current, either A.C. or D.C., for resistance heating of the iron wire element 18 as necessary to maintain that element near or substantially at the Curie temperature. The element 18 is thereby conditioned to exhibit a high degree of permeability in weak magnetic fields such as the earth's field.

Figure 3:
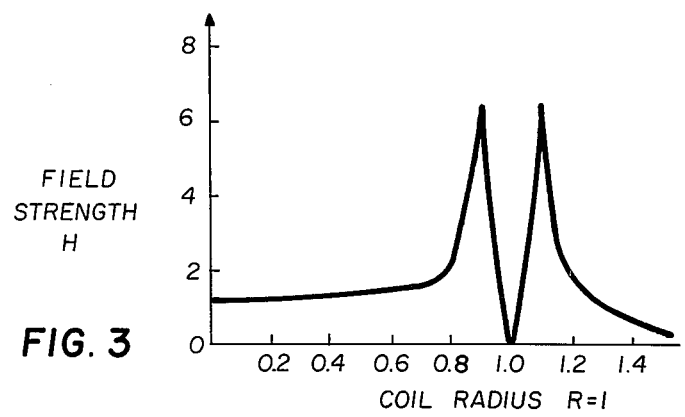
FIG. 3 is graphic illustration of a magnetic field strength pattern of an electrical coil.

The annular sensor 16 is preferably of a diameter that is slightly more than or slightly less than that of the coil 14 so that the element 18 provides the greatest effect on the induction of the coil 14 for its small mass of iron. Referring to FIG. 3, it will be seen that the field strength of a circular coil, such as coil 14, formed of a wire of small diameter, when plotted against the coil radius R, provides two peaks. These peaks are located substantially at 0.9 R and 1.1 R. Thus, the element 18 is most effective on the induction of coil 14 if its radius is about 0.9 or 1.1 the radius of the coil 14.

The sensor 16 may be disposed inside of, outside of, or adjacent the coil 14, so long as it is located well within the magnetic field thereof when the oscillator 12 is operating. When so located, the inductance of the coil 14 will be dependant upon the permeability of the element 18 which serves as a core thereof. It will be understood that throughout this specification, the term "core" is not intended to limit the element 18 to a position within coil 14, but is intended to include that position as well as the mentioned positions outside or adjacent that coil.

Figure 4:
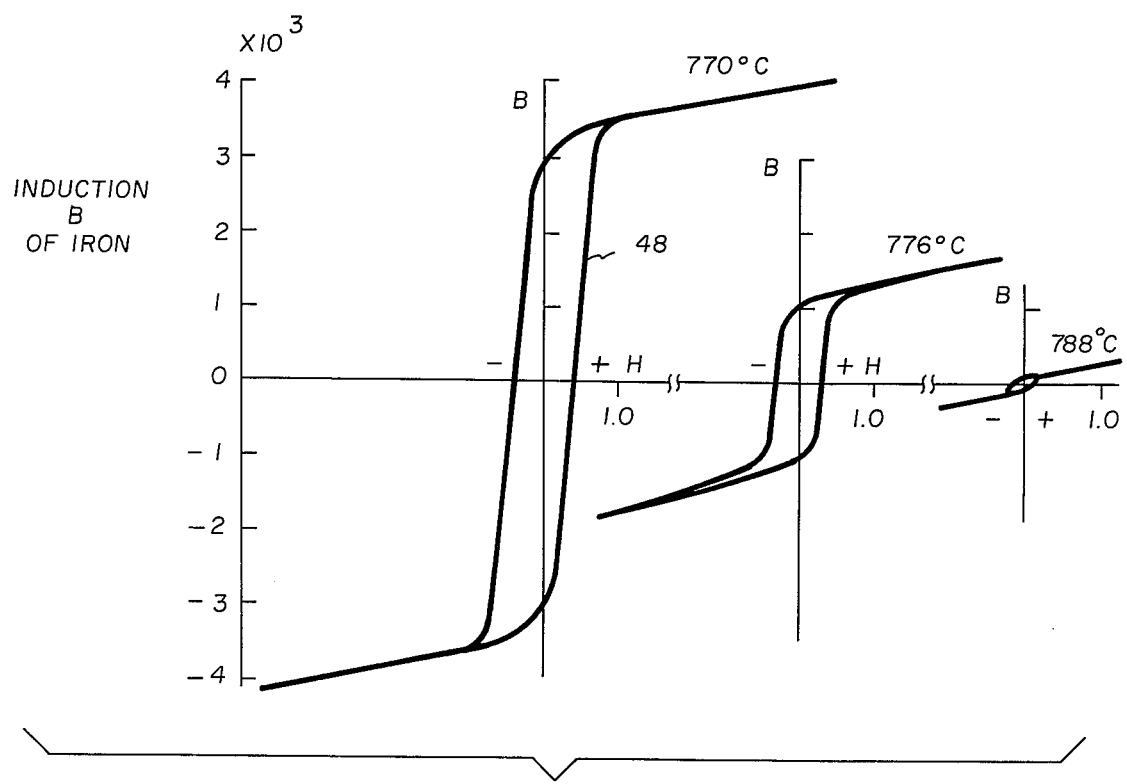
FIG. 4 is a family of hysteresis curves graphically illustrating changes in induction at elevated temperatures near the Curie point of iron.

Because of the high permeability of the element 18 near its Curie point and in the presence of weak magnetic fields, that element can be operated in a particularly steep portion of its hysteresis curve where small variations in magnetic field H will result in large changes in induction B. This is shown graphically in FIG. 4, by the B-H curve for iron held at about 770° C. Inasmuch as the inductance L of the coil 14 will in large measure be determined by the induction B of the element 18 serving as a core, the operating frequency of the oscillator 12 will change in accordance with field variations producing changes in the induction B. As is well known in the art, if the oscillator 12 is of the Hartley type, for example, wherein the coil 14 forms part of an L-C tank circuit, increasing the inductance will decrease the operating frequency whereas decreasing the inductance will increase the frequency.

The thermostatic heating current source 26 holds the iron of wire element 18 of the sensor 16 at a temperature preferrably in the range of about 700° to 770° C where the permeability will be between 8,000 and 10,000, and the induction B will fall in the nearly vertical portion 48 of the hysteresis curve for field strengths in the range characteristic of the earth, namely 0.34 to 0.54 oersteds.

The output of the oscillator 12, which is conveniently operated in the R.F. range, comprises an A.C. signal represented by flow line 30. That signal, the frequency of which varies in a determinable manner with change in field strength sensed by sensor 16, is applied as a first input to a mixer 32. The mixer 32 receives a second input in the form of an A.C. signal 34 from a crystal controlled oscillator 36 and produces an output signal 38 containing sum and difference in frequencies. A discriminator 40 provides an analog representation of one of those frequencies, usually the difference, as its output 42 could be used to perform control, alarm, or other functions.

While a presently preferred embodiment of the invention has been illustrated and described it will be understood that other forms and embodiments are contemplated. Thus, the sensor element may have a shape different than the element 18. For example, the element may comprise a straight rod surrounded by an oscillator coil, or the sensing element may itself be the oscillator coil if formed of iron or other material having the features of increased permeability in weak fields when held at an elevated temperature near its Curie point. In these circumstances the magnetometer will be directional in sensitivity and can be used for determining magnetic field components.

Figure 5:
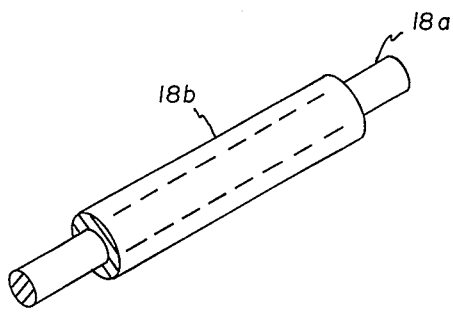
FIG. 5 is a fragmentary perspective view of a segment of wire forming part of an alternative embodiment of the invention.

As shown in FIG. 5, the sensing element 18 may comprise a core 18a of a strong, easily heated resistive material such as nichrome that is preferably regarded as non-magnetic and an outer cladding or layer 18b of iron or other suitable ferromagnetic material exhibiting the required Curie point characteristics.

While substantially pure iron is the presently preferred material for the ferromagnetic sensing element it is contemplated that other materials, such as silicon-iron of the type used for transformer core laminations, may also be used so long as the material exhibits permeability that increases with temperature near its Curie point while in a weak magnetic field in the range of about 0.24 to about 0.64 oersteds and is further characterized by a B-H or hysteresis curve having a nearly vertical portion in that same range. In the case of silicon-iron it will be recognized that the sensing element can be cut, drawn, or otherwise formed with a predetermined orientation of the crystaline structure so as to obtain additional directionally sensitive capabilities for the magnetometer.

It will be appreciated from the foregoing description, that magnetometers embodying the invention can be made very small, light in weight, and of low power drain. Most importantly, magnetometers embodying the invention do not require large iron or other ferromagnetic masses, field concentrators, or permanent magnets or electromagnets as biasing means.

Obviously, other embodiments and modifications of the subject invention will readily come to the mind of one skilled in the art having the benefit of the teachings presented in the foregoing description and the drawing. For example, the heating of the sensor element may be accomplished by other means, such as by a separate heater in an enclosure, therewith, or by induction heating. It is, therefore, to be understood that this invention is not to be limited to the preferred embodiment and that said modifications and alternative embodiments are intended to be included within the scope of the appended claims.

What is claimed is:

1. A magnetometer of the type including oscillator means having an induction coil as part of an operating frequency determining resonant circuit, and magnetic field sensor means associated with said induction coil for changing inductance thereof and correspondingly changing said operating frequency in response to changes in a weak magnetic field, said magnetometer being characterized by the improvement comprising:

said oscillator means comprising a radio frequency oscillator and said induction coil having a predetermined radius;

said sensor means comprising a ferromagnetic sensor element having a permeability that, when in a weak magnetic field of strengths characteristic of the earth's magnetic field, increases with increases in temperature toward a Curie temperature that is elevated relative to normal room temperatures, said element having a magnetic induction B to magnetizing force H hysteresis curve at a predetermined temperature near said Curie temperature that is characterized by a steep slope in the region of said weak magnetic field;

means for heating said element so as to maintain the temperature of said element constant at said predetermined temperature, whereby small changes in said weak magnetic field produce large changes in said inductance and said operating frequency; and said element being substantially free of any magnetic field biasing means or field concentrator means.

2. A magnetometer as defined in claim 1 and further characterized by said sensor element comprising a wire filament comprising substantially pure iron and said means for heating said element comprising a thermostatically controlled source of electric current connected to said filament and operative to effect resistance heating thereof to said constant predetermined temperature said wire filament being configured in a zig-zag loop form so as to concentrate its mass in a cylindrical zone having a radius of about 0.9 or 1.1 times said radius of said induction coil.

3. A magnetometer as defined in claim 2, and wherein said wire filament comprises a substantially non-magnetic core and an iron cladding.

4. A magnetometer as defined in claim 3, and wherein said wire filament is housed in protective means comprising an inert gas filled envelope.

* * * * *